United States Patent
Chang

(10) Patent No.: US 7,660,141 B2
(45) Date of Patent: Feb. 9, 2010

(54) LAYOUT STRUCTURES AND METHODS OF FABRICATING LAYOUT STRUCTURES

(75) Inventor: Soo-bong Chang, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 51 days.

(21) Appl. No.: 11/878,066

(22) Filed: Jul. 20, 2007

(65) Prior Publication Data

US 2008/0080282 A1    Apr. 3, 2008

(30) Foreign Application Priority Data

Sep. 29, 2006  (KR) ............... 10-2006-0096132

(51) Int. Cl.
*G11C 5/06* (2006.01)
(52) U.S. Cl. .............. 365/63; 365/51; 365/203; 365/205
(58) Field of Classification Search ........... 365/51, 365/63, 203, 205
See application file for complete search history.

(56) References Cited

U.S. PATENT DOCUMENTS

| 6,262,922 | B1 | 7/2001 | Nakamura et al. | |
|---|---|---|---|---|
| 6,721,221 | B2 | 4/2004 | Schreck | |
| 7,138,684 | B2* | 11/2006 | Hidaka et al. | 257/351 |
| 7,184,330 | B2* | 2/2007 | Tajima et al. | 365/200 |

FOREIGN PATENT DOCUMENTS

| JP | 06-140592 | 5/1994 |
|---|---|---|
| KR | 2004-0041097 | 5/2004 |

OTHER PUBLICATIONS

Office Action for corresponding Korean Application No. 10-2006-096132 dated Aug. 31, 2007.

* cited by examiner

*Primary Examiner*—Hoai V Ho
(74) *Attorney, Agent, or Firm*—Harness, Dickey & Pierce, PLC

(57) ABSTRACT

Example embodiments may provide a layout structure and layout method for a memory device that may reduce the area of the memory device. Example embodiment layout structures may include a first region and/or a second region. First and second sensing MOS transistors of a sense amplifier that senses data of a bit line and a complementary bit line may be arranged in the first region. First, second and third equalization MOS transistors of an equalizer that equalizes the bit line and the complementary bit line may be arranged In the second region located apart from the first region, Sensing NMOS transistors and equalization NMOS transistors may share an N-type active region in the layout structure of a memory device, and the area of a sense amplifier may be reduced.

13 Claims, 7 Drawing Sheets

LAYOUT STRUCTURES AND METHODS OF FABRICATING LAYOUT STRUCTURES

PRIORITY STATEMENT

This application claims priority under 35 U.S.C. § 119 to Korean Patent Application No. 10-2006-0096132, filed on Sep. 29, 2006, in the Korean Intellectual Property Office, the entire contents of which are incorporated herein by reference.

BACKGROUND

1. Field

Example embodiments may relate to a sense amplifier, for example, to a sense amplifier having a smaller area.

2. Description of the Related Art

FIG. 1A illustrates a related art open bit line structure having a connection of bit line pairs BL and /BL, sense amplifiers 111, and memory cells 101, 102, and 103. As shown in FIG. 1A, the bit line BL and the complementary bit line /BL may be included in different memory cells in related art open bit line structure. In a folded bit line structure (not shown), a bit line BL and a complementary bit line /BL may be arranged in parallel and may be included in the same memory cell. The sense amplifier 111 may sense a voltage difference between a bit line 121 and a complementary bit line 123 connected to the memory cells 101 and 102, respectively, arranged at both sides of the sense amplifier 111.

FIG. 1B illustrates a related art 6F2 (2F×3F) memory cell used in open bit line structure. Many memory cells used in the open bit line structure may have a 6F2 structure, while many memory cells used in the folded bit line structure may have an 8F2 structure.

As shown in FIG. 1B, the ratio of the horizontal size of the related art 6F2 memory cell to the vertical size may be about 3:2. A single related art memory cell may include a single MOS transistor 171 and/or a single capacitor 173. The vertical distance between a ground voltage source and a bit line BL may be referred to as 2F and the shortest distance between the capacitor 173 and a word line WL may be referred to as 3F. 6F2 may indicate that the area occupied by a single memory cell is 2F×3F. In the related art 8F2 structure, the horizontal and vertical distances of a memory cell may be respectively 4F and 2F, and the area occupied by a single memory cell may be 2F×4F.

The area of a bit line sense amplifier included in a related art memory device having a 6F2 memory cell may be dependent upon a front layer. A front layer may be the total layout area of an active region, a direct contact, and a gate poly of a MOS transistor. The area of the bit line sense amplifier may be dependent upon the active region of a MOS transistor, the distance between the direct contact and the gate poly of the MOS transistor, and/or the length of the direct contact. The active region may be a region in which holes and/or electrons may be heavily doped to form source and/or drain regions of a MOS transistor. In a PMOS transistor, source and/or drain regions may be doped with p+ impurities, and holes may form a channel. In an NMOS transistor, the active region may be doped with n+ impurities. The direct contact may be a node at which a voltage line (bit line) may be connected to the source, gate, or drain of a MOS transistor to apply a voltage to the source, gate, or drain.

A MOS transistor may be designed according to a design rule in order to perform a normal operation desired by a user. To prevent a short-circuit of the source and/or drain of the MOS transistor and generation of a parasitic capacitance, a specific rule may be specified. For example, the channel of the MOS transistor may not short-circuit if a distance between the gate and the source direct contact of the MOS transistor and a distance between the gate and the drain direct contact of the MOS transistor are maintained. The gate and the direct contacts may be arranged having substantially constant distances between them to satisfy the design rule.

The design rule may be variably applied to each MOS transistors. The design rule may be applied to a MOS transistor to be fabricated in consideration of the voltage, size, and layout structure of the MOS transistor. For example, an NMOS transistor that is about 2 μm in width and about 4 μm in length may be turned on by a 0.6V potential applied to its gate. If the channel of the NMOS transistor short-circuits when the distance between the gate and the drain direct contact departs from about 0.3 μm, a design rule that the distance between the gate and the drain direct contact be maintained greater than about 0.3 μm may be applied. Accordingly, the design rule may not be fixed and may vary with the conditions of a MOS transistor to which the design rule is applied.

The distance between a direct contact and the gate of a MOS transistor may be one of the elements determining the area of the front layer. The area of the front layer may be reduced by decreasing the distance between the direct contact and the gate.

FIG. 2 is a circuit diagram of a related art bit line sense amplifier 200. As shown in FIG. 2, the related art bit line sense amplifier 200 may include a sensing unit 210, an equalizer 230, and/or a sensing controller 250. The sensing unit 210 may sense a bit line pair including a bit line BL and/or a complementary bit line /BL. The sensing unit 210 may include a sensing NMOS transistor pair 216 and 218 and/or a PMOS sensing transistor pair 212 and 214.

The equalizer 230 may include a first equalization transistor 232 and/or a second equalization transistor 234 and may equalize the bit line pair BL and /BL in a period during which a sensing operation may not be performed. In the period during which the sensing operation may not be carried out, an equalization control signal PEQIJB at a logic high level may be applied to the first and second equalization transistors 232 and 234 to turn on the first and second equalization transistors 232 and 234. The bit line BL and the complementary bit line /BL may be electrically connected to each other and may have the same voltage.

The sensing controller 250 may include first, second, third, and/or fourth NMOS transistors 252, 254, 256, and 262 and may control the voltages of the bit line BL and the complementary bit line /BL before and after the bit line BL and the complementary bit line are sensed. If a wordline enabling signal WLE at a logic high level is applied to the bit line sense amplifier 200 to start the sensing operation, a first control signal LANG at a logic high level may be applied to turn on the fourth NMOS transistor 262. The voltage of a second node N2 may become a low power supply voltage V_SS. The voltage VBL of the bit line BL before the bit line BL is sensed may be applied to the gate of the second sensing NMOS transistor 218 of the sensing unit 210, and the second sensing NMOS transistor 218 may turn on. The voltage of the second node N2 may be applied to the complementary bit line /BL, and the voltage difference between the bit line BL and the complementary bit line /BL may increase.

Before the sensing operation, the first, second, and third NMOS transistors 252, 254, and 256 of the sensing controller 250 may be all turned on. First, second and third nodes N1, N2, and N3 may have the same voltage as the voltage VBL. Because the first and second equalization transistors 232 and 234 may be all tuned on before the sensing operation, the voltages of the bit line BL and the complementary bit line /BL may correspond to the voltage of the third node N3. Both the bit line BL and the complementary bit line /BL may have the voltage VBL.

The area of the bit line sense amplifier 200 may be determined by the front layer, as described above with reference to FIG. 1B. In the related art bit line sense amplifier 200, the equalizer 230 and the sensing unit 210 each may have active regions. The layout structure of the first and second NMOS transistors 216 and 218 of the sensing unit 210 and the first and second equalization transistors 232 and 234 of the equalizer 230 may include four gates, four source direct contacts, and/or four drain direct contacts. The distances between the direct contacts and the gates may be maintained greater than values according to the design rule. The area of the conventional bit line sense amplifier may increase.

It may be necessary to reduce the area of the conventional bit line sense amplifier by decreasing the number of gates included in the sense amplifier or changing the layout structure.

SUMMARY

Example embodiments may provide a sense amplifier structure with reduced area in which N-type sensing transistors and N-type equalization transistors may share an N-type active region.

Example embodiments may provide a layout structure of a memory device including a first region, a second region, and/or a third region. First and second sensing MOS transistors of a sense amplifier that senses data of a bit line and a complementary bit line may be arranged in the first region. First, second and third equalization MOS transistors of an equalizer that equalizes the bit line and the complementary bit line may be arranged in the second region, which is located apart from the first region. The first region and the second region may share an active region.

The third region may include first, second, and third sensing NMOS transistors for equalizing the drain of a first sensing PMOS transistor and/or the source of a first sensing NMOS transistor.

The active region may be an n+ doped active region. The n+ doped active region may be shared by the drain and source regions of the first sensing MOS transistor, the drain, and/or source regions of the second sensing MOS transistor, and the source and drain regions of the first equalization MOS transistor.

The gate of the first equalization MOS transistor may be between the gate of the first sensing MOS transistor and the gate of the second sensing MOS transistor.

The gates of the second and third equalization MOS transistors may be arranged in parallel and/or adjacent to each other. The gates of the second and third equalization MOS transistors may be vertically at one side of the gate of the first equalization MOS transistor and at one side of a region where the first and second sensing MOS transistors may be arranged.

If the memory device includes memory cells and a sub wordline driver located at one side of each of the memory cells, the first and second regions may be between horizontally neighboring memory cells. The third region may be in a region between neighboring sub wordline drivers between vertically neighboring memory cells.

Example embodiments may provide a layout method for a memory device including forming an n+ doped active region, arranging gates of first and second sensing NMOS transistors that sense data of a bit line and a complementary bit line, and/or arranging gates of first, second, and third equalization MOS transistors of an equalizer that equalizes the bit line and the complementary bit line. The gates of the first and second sensing NMOS transistors and the gates of the first, second and third equalization MOS transistors may be arranged in the n+ doped active region such that the first and second sensing NMOS transistors and the first, second, and third equalization MOS transistors may share the n+ doped active region.

BRIEF DESCRIPTION OF THE DRAWINGS

The above and/or other features and advantages of example embodiments become more apparent with reference to the attached drawings in which.

DETAILED DESCRIPTION

Figure 1A:
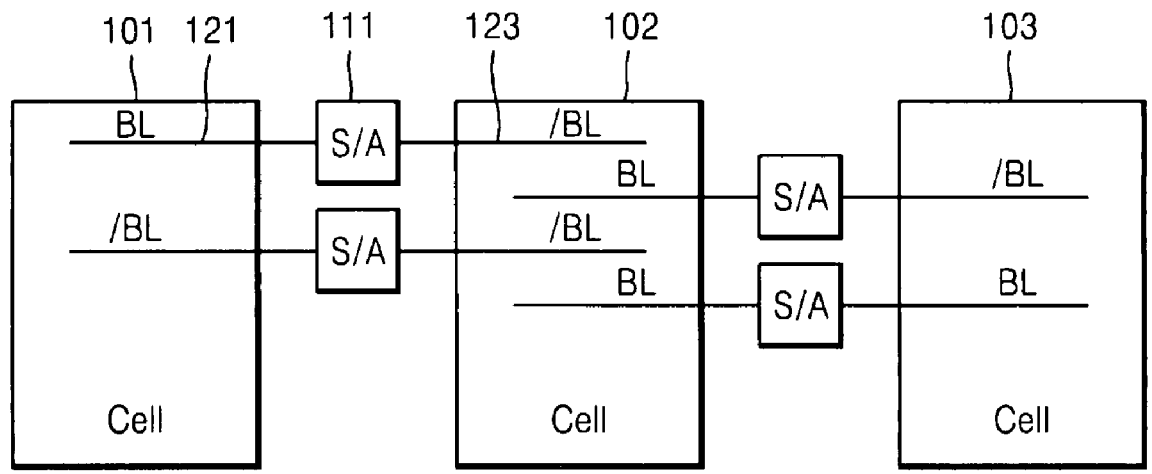
FIGS. 1A and 1B illustrate a connection of bit line pairs, sense amplifiers, and memory cells in a related art open bit line structure.
Figure 1B:
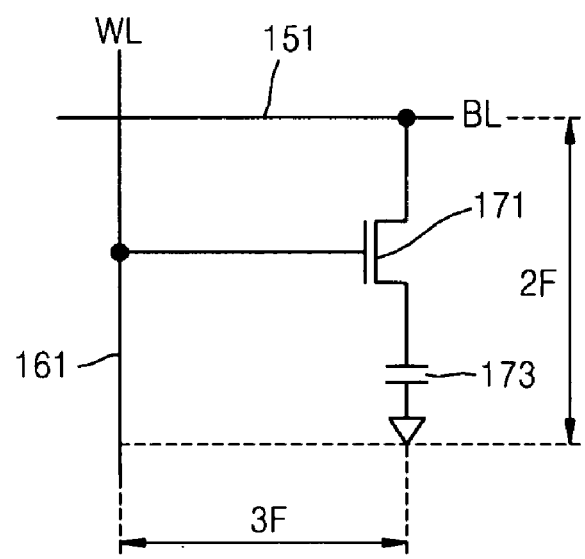

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
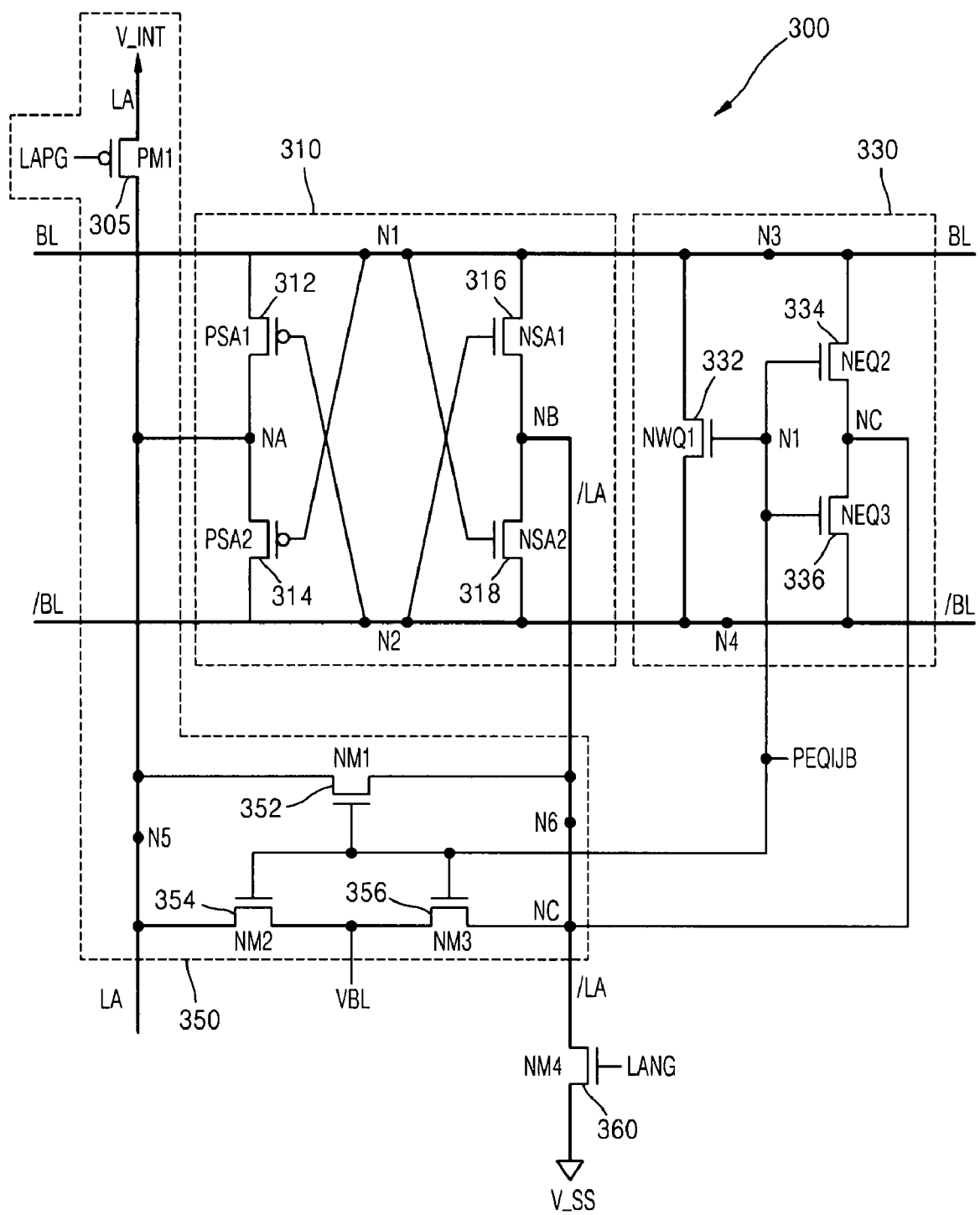
FIG. 3 is a circuit diagram of an example embodiment bit line sense amplifier.

FIG. 3 is a circuit diagram of an example embodiment bit line sense amplifier 300. As shown in FIG. 3, the bit line sense amplifier 300 may include a sensing unit 310, an equalizer 330, and/or a sensing controller 350.

The sensing unit 310 may include sensing PMOS transistors 312 and 314 connected in series between a bit line BL and a complementary bit line /BL and/or sensing NMOS transistors 316 and 318 connected in series between the bit line BL and the complementary bit line /BL. The sensing unit 310 may sense the bit line BL and the complementary bit line /BL.

The equalizer 330 may include first, second, and/or third equalization transistors 332, 334, and 336 and may equalize the bit line BL and the complementary bit line /BL if the bit line BL and the complementary bit line /BL are not sensed. In example embodiments, equalizing may include maintaining a constant voltage between bitlines. In example embodiments, an equalizer may maintain a constant voltage between bitlines.

The sensing controller 350 may include first, second, third, and/or fourth NMOS transistors 352, 354, 356 and 360 and/or a PMOS transistor 305 and may control the voltages of the bit line BL and the complementary bit line /BL before and after the bit line BL and the complementary bit line /BL are sensed.

Figure 4:
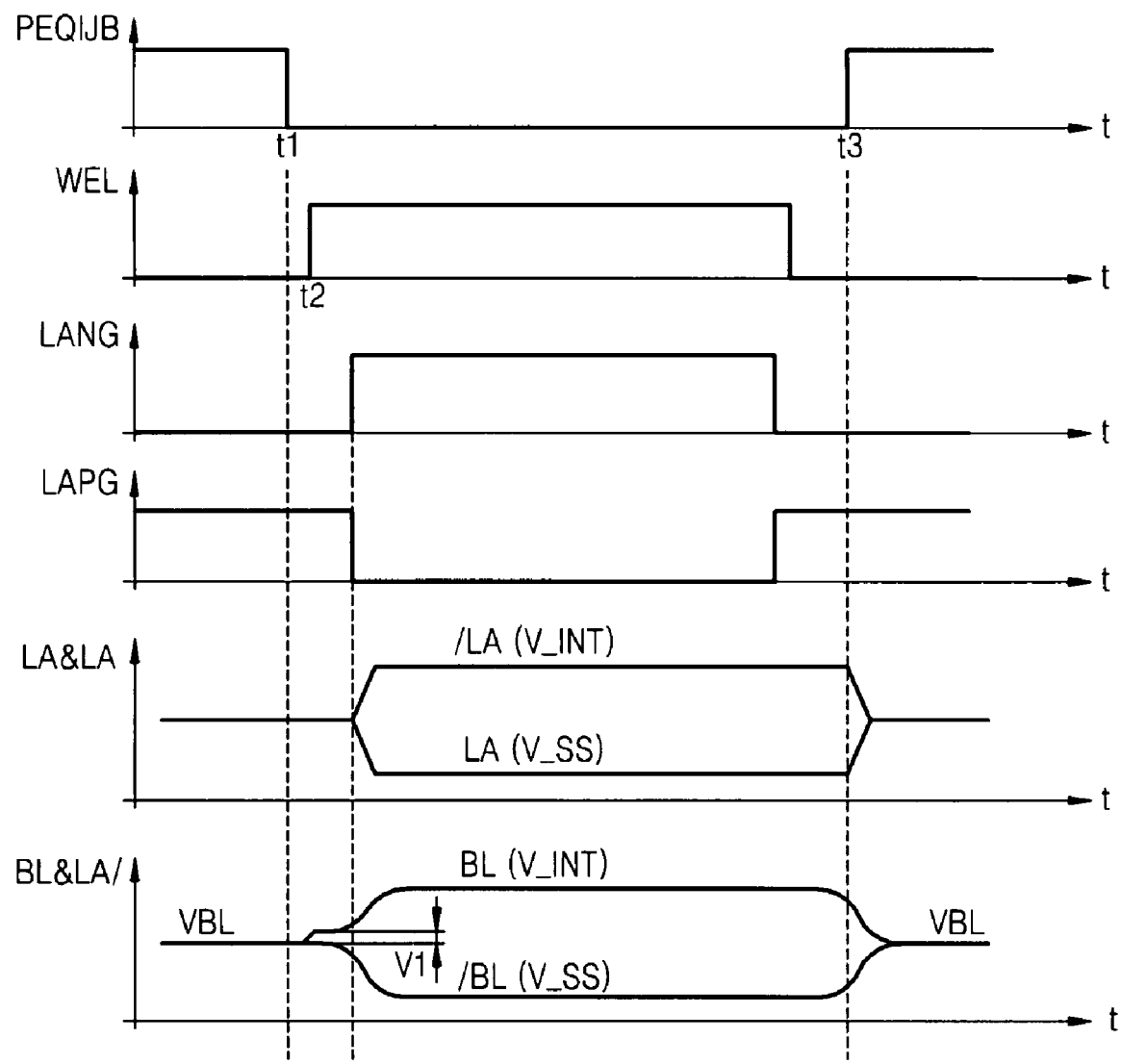
FIG. 4 is a timing diagram of signals in the bit line sense amplifier illustrated in FIG. 3.

FIG. 4 is a timing diagram of signals in the example embodiment bit line sense amplifier 300 illustrated in FIG. 3. The operations of the bit line sense amplifier before and after the bit line and the complementary bit line are sensed is illustrated in FIGS. 3 and 4.

As shown in FIG. 4, before time t1 during which the bit line BL and the complementary bit line /BL are not sensed, an equalization control signal PEQJIB at a logic high level may be applied to the bit line sense amplifier 300 to turn on the first, second, and/or third NMOS equalization transistors 332, 334, and 336. A third node N3 and/or a fourth node N4 of the equalizer 330 short-circuit, and the bit line BL and the complementary bit line /BL may have the same voltage. A wordline enabling signal WLE at a logic low level may be applied to the bit line sense amplifier 300 because the sensing operation may not be carried out.

First and second control signals LANG and LAPG used in the sensing controller 350 may be applied to the bit line sense amplifier 300 as a logic low signal and a logic high signal if the wordline enabling signal WLE at a logic high level is applied to the bit line sense amplifier 300 to start the sensing operation. The first and second control signals LANG and LAPG may have a logic low level and a logic high level, respectively, before the sensing operation.

The first control signal LANG at a logic low level may be applied to the fourth NMOS transistor 360 of the sensing controller 350 to turn off the fourth NMOS transistor 360. The second control signal LAPG at a logic high level may be applied to the first PMOS transistor 305 to turn off the first PMOS transistor 305. A node NA and/or a node NB of the sensing unit 310 may have a high power supply voltage V_INT and a low power supply voltage V_SS, respectively.

Before the sensing operation, the equalization control signal PEQIJB at a logic high level may be applied to the bit line sense amplifier 300, and the first, second, and/or third NMOS transistors 352, 354 and 356 may be turned on. At this time, the equalized bit line voltage VBL may be applied to one terminal of the second NMOS transistor 354, and thus a fifth node N5 and a sixth node N6 both may have the equalized bit line voltage VBL. The node NA and the node NB may have the equalized bit line voltage VBL. The bit line BL and the complementary bit line /BL may have the equalized bit line voltage VBL.

As shown in FIG. 4, if the equalization control signal PEQJIB at a logic low level is applied to the bit line sense amplifier 300 after t1, the voltages of the equalized bit line BL and the complementary bit line /BL may differ from each other. The wordline enabling signal WLE at a logic high level may be applied to the bit line sense amplifier 300 such that the bit line sense amplifier 300 may perform the sensing operation and the first control signal LANG at a logic high level and the second control signal at a logic low level may be applied to the bit line sense amplifier 300.

The first, second, and/or third NMOS equalization transistors 332, 334, and 336 of the equalizer 320 may receive the equalization control signal PEQIJB at a logic low level through their gates and may be all turned off.

The fourth NMOS transistor 360 may be turned on, and the low power supply voltage V_SS may be applied to the node NB and a node NC because the first control signal LANG at a logic high level may be applied. The first PMOS transistor PM1 may be turned on and the high power supply voltage V_INT may be applied to the node NA because the second control signal LAPG at a logic low level may be applied. A line LA may have the low power supply voltage V_SS and an inverted line /LA may have the high power supply voltage V_INT.

If the sensing operation is started, the voltage of the bit line BL may be slightly increased (for example, by about 1V), the first sensing PMOS transistor 312 to which a relatively little low voltage may be applied through its gate may be turned on, and/or the second sensing PMOS transistor 314 to which a relatively little high voltage may be applied through its gate may be turned off. The voltage of the first node N1 may become the high power supply voltage V_INT corresponding to the voltage of the node NA.

The second sensing NMOS transistor 318 may be turned on and the first sensing NMOS transistor 316 may be turned off because the voltage of the bit line BL may be slightly increased (for example, by about 1V). The voltage of the second node N2 may become the lower power supply voltage V_SS corresponding to the voltage of the node NB. The bit line BL and the complementary bit line /BL may be sensed and have a voltage difference (for example, about V_INT−V_SS) between them.

Figure 5:
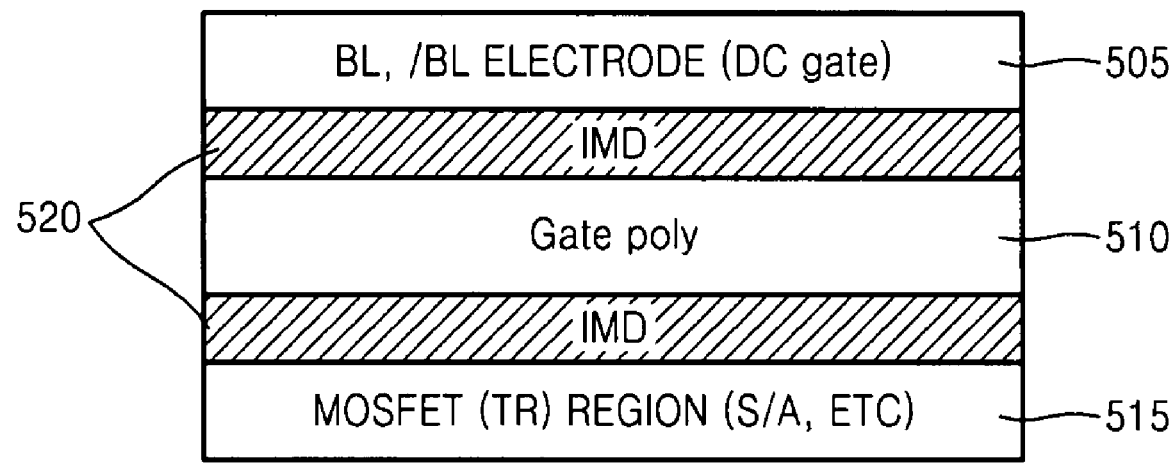
FIG. 5 illustrates a vertical layout structure of elements included in the bit line sense amplifier illustrated in FIG. 3.

FIG. 5 illustrates a vertical layout structure of elements that may be included in the example embodiment bit line sense amplifier illustrated in FIG. 3. As shown in FIG. 5, a layer 515 may include elements for forming a MOS transistor. The elements may include a P-well and an n+ doped active region in the case of an NMOS transistor. The first, second, and third equalization NMOS transistors 332, 334, and 336, the first and second sensing NMOS transistors 316 and 318, the first and second sensing PMOS transistors 312 and 314, the first, second, third, and fourth MOS transistors 352, 354, 356, and 360, and/or the PMOS transistor 305 illustrated in FIG. 3 may be included in the layer 515. To fabricate a MOS transistor, a N-well or P-well may be formed and then an n+ doped or p+ doped active region may be formed thereon (not shown). The fabrication of an MOS transistor may be achieved by a process well known in the art.

A gate poly layer 510 may be on the layer 515 to form a channel using the active region formed in the layer 515.

A metal line for forming the bit line BL and/or the complementary bit line /BL may be arranged on the gate poly layer 510 to connect a gate formed in the gate layer 510 to a source and/or a drain formed in the layer 515 using an electrically conductive material to transmit data in the form of voltage or current.

An inter-metal dielectric layer 520 may be located between the layer 505 and the layer 510 and between the layer 510 and the layer 515. A direct contact (not shown) may be formed using a via (not shown) to connect the bit line BL and the complementary bit line /BL of the layer 505 to the gate layer 510 or the source and drain formed in the layer 515.

Figure 6:
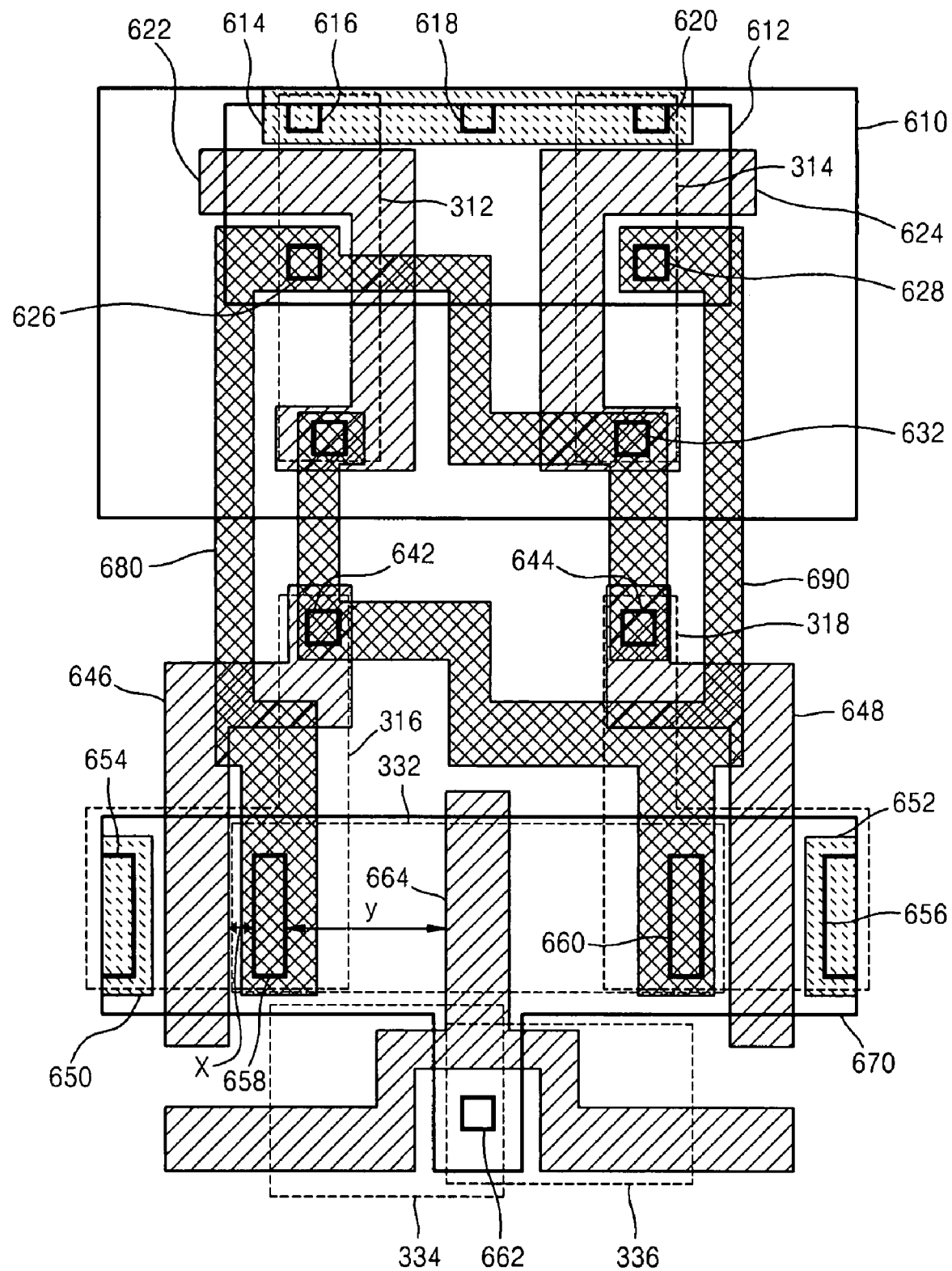
FIG. 6 illustrates a horizontal layout structure of the elements included in the bit line sense amplifier illustrated in FIG. 5.

FIG. 6 illustrates a horizontal layout structure of the elements that may be included in the example embodiment bit line sense amplifier illustrated in FIG. 3. As shown in FIG. 6, the layout may include a first region, a second region, and a third region. The first region may include the first and second sensing NMOS transistors 316 and 318 and the first and second sensing PMOS transistors 312 and 314. The second region may include the first, second, and third equalization NMOS transistors 332, 334, and 336. The third region may include the first, second and third NMOS transistors of the sensing controller 350 illustrated in FIG. 3. The first and second sensing NMOS transistors 316 and 318 in the first region and the first, second, and third equalization NMOS transistors 332, 334, and 336 in the second region may share an n+ doped active region 670.

A gate poly 646 of the first sensing NMOS transistor 316 may be connected to the complementary bit line /BL through a direct contact 642. A source 658 and/or a drain 654 of the first sensing NMOS transistor 316 may be in the n+ doped active region 670 at both sides of the gate poly 646.

A gate poly 648 of the second sensing NMOS transistor 318 may be connected to the bit line BL 680 through a direct contact 644. A source 660 and/or a drain 656 of the second sensing NMOS transistor 318 may be arranged in the n+ doped active region 670 at both sides of the gate poly 648.

A gate poly 664 of the first equalization NMOS transistor 332 may be between the gate poly 646 of the first sensing NMOS transistor 316 and the gate poly 648 of the second sensing NMOS transistor 318.

Figure 2:
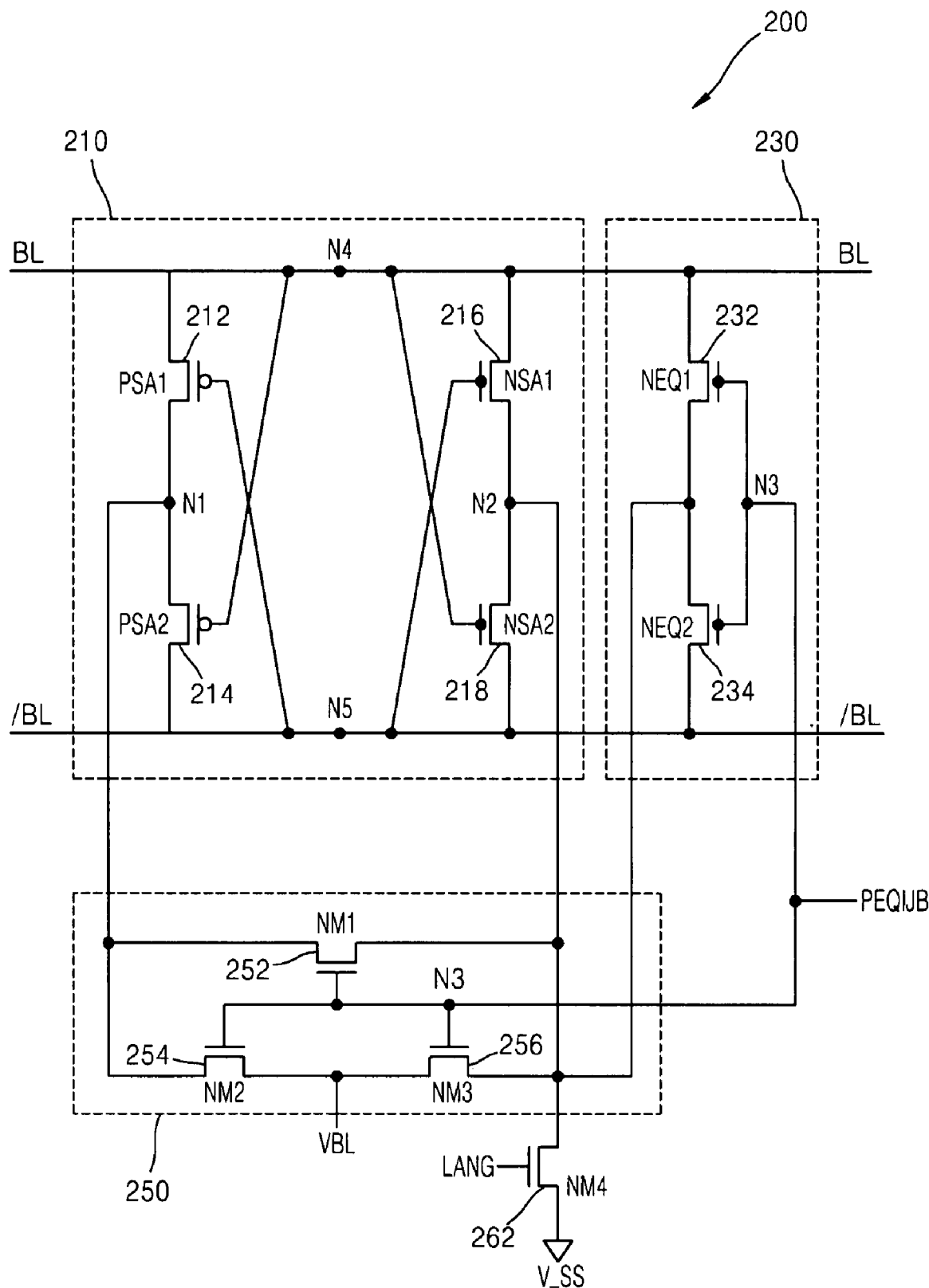
FIG. 2 is a circuit diagram of a related art bit line sense amplifier.

If a distance x between the gate poly 646 and the source 658 is required by a design rule of the bit line sense amplifier, the width of the example embodiment bit line sense amplifier may be reduced by 2*(y−x), where y is a distance between the source 658 and gate 664, compared to the related art bit line sense amplifier illustrated in FIG. 2. The related art bit line sense amplifier illustrated in FIG. 2 may need four gates, four source direct contacts, and/or four drain direct contacts in the width direction. The example embodiment bit line sense amplifier may require three gates 646, 664 and 648, two source direct contacts 654 and 660, and/or two drain direct contacts 658 and 656 in the width direction. The width of the example embodiment sense amplifier may be reduced by approximately 20% compared to the related art sense amplifier.

Gates of the second and third equalization NMOS transistors 334 and 336 may be arranged in the horizontal direction under the first and second sensing NMOS transistors 316 and 318. A source and a drain of the second equalization NMOS transistor 334 and a source and a drain of the third equalization NMOS transistor 336 may share the n+ doped active region 670. A direct contact 662 used for the source of the second equalization NMOS transistor 334 and/or the drain of the third equalization NMOS 336 may correspond to the node NC illustrated in FIG. 3.

A gate poly 622 of the first sensing PMOS transistor 312 may be at the top and to the left of the layout. A source 626 and/or a drain 616 of the first sensing PMOS transistor 312 may be included in a p+ doped active region 612. The gate poly 622 may be connected to a complementary bit line 690 through a gate direct contact 630 included in the gate 622.

A gate poly 624 of the second sensing PMOS transistor 314 may be at the top and to the right of the layout. A source 620 and a drain 628 of the second sensing PMOS transistor 314 may be included in the p+ doped active region 612. The gate poly 624 may be connected to a bit line 680 through a gate direct contact 628 included in the gate 624.

A drain direct contact 616 of the first sensing PMOS transistor 312, a source direct contact 620 of the second sensing PMOS transistor 314 and a direct contact 618 connecting the line LA may be interconnected through a metal line 614 to form the node NA.

The bit line 680 formed of a conductor may electrically connect a source direct contact 626 of the first sensing PMOS transistor 312, a gate direct contact 632 of the second sensing PMOS transistor 314, a drain direct contact 658 of the first sensing NMOS transistor 316, and/or a gate direct contact 644 of the second sensing NMOS transistor 318.

The complementary bit line 690 formed of a conductor may electrically connect a gate direct contact 630 of the first sensing PMOS transistor 312, a drain direct contact 628 of the second sensing PMOS transistor 314, a gate direct contact 642 of the first sensing NMOS transistor 316, and/or a source direct contact 660 of the second sensing NMOS transistor 318.

Figure 7:
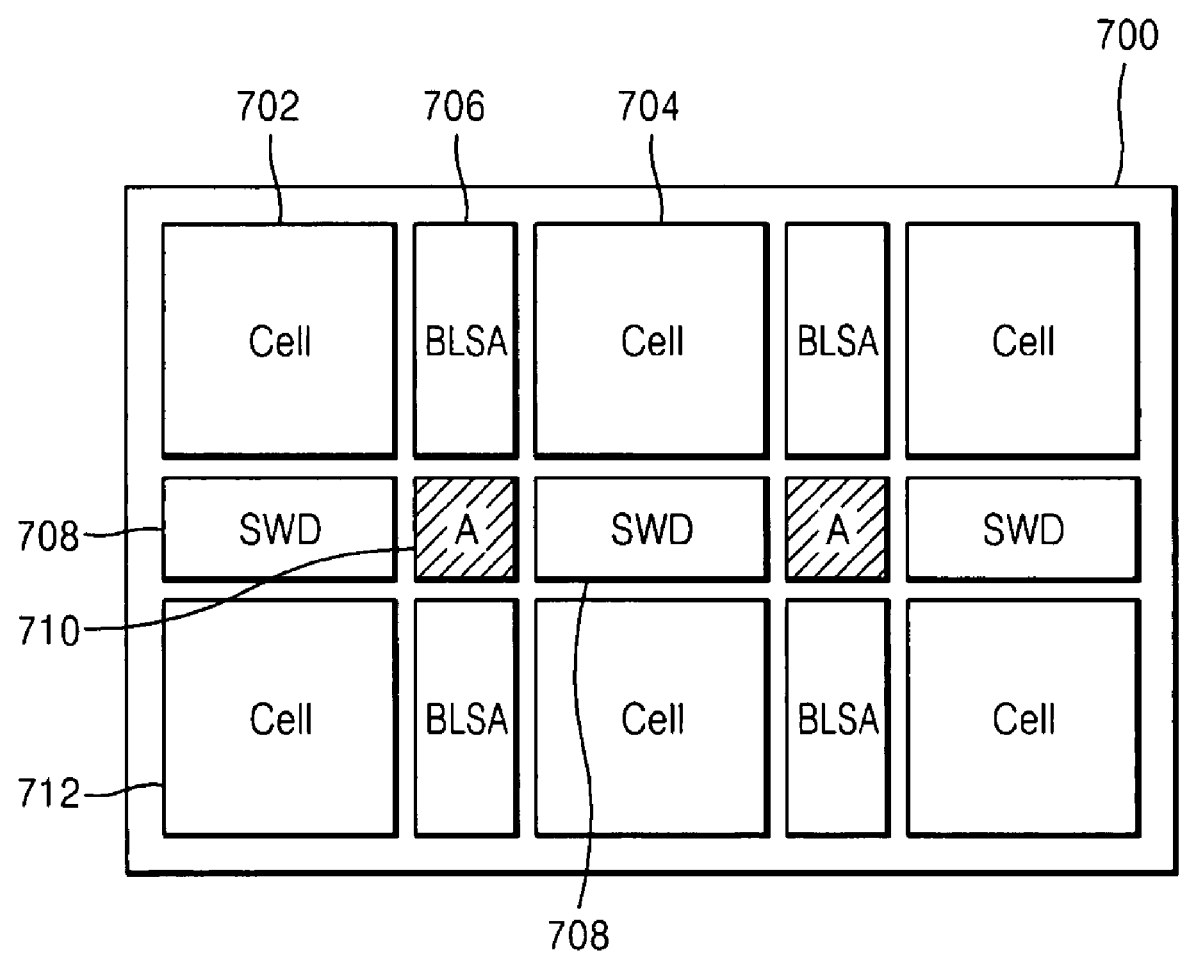
FIG. 7 illustrates the structure of a semiconductor device employing the bit line sense amplifier illustrated in FIG. 3.

FIG. 7 illustrates the structure of a semiconductor device 700 that may employ the example embodiment sense amplifier illustrated in FIG. 3. As shown in FIG. 7, the semiconductor device 700 may include a plurality of memory cells 702, 704, and 712. The example embodiment bit line sense amplifier may be in a region 706 between neighbouring memory cells 702 and 704. A sub wordline driver 708 may be between neighbouring memory cells 702 and 712.

The sensing unit 310 and the equalizer 330 of the bit line sense amplifier may be between the horizontally neighboring memory cells 702 and 704 and the sensing controller 350 may be located in a region A 710 between neighboring sub wordline drivers 708 and between neighboring bit line sense amplifiers. Space utilization efficiency of the semiconductor device 700 may be improved.

An example embodiment layout method of a semiconductor memory device may include forming a structure similar to that described in example embodiments that those with ordinary skill in the art will understand from the above-described explanation. Example embodiments may provide a layout method for a memory device including forming an n+ doped active region, arranging gates of first and second sensing NMOS transistors that sense data of a bit line and a complementary bit line, and/or arranging gates of first, second, and third equalization MOS transistors of an equalizer that equalizes the bit line and the complementary bit line. The gates of the first and second sensing NMOS transistors and the gates of the first, second and third equalization MOS transistors may be arranged in the n+ doped active region such that the first and second sensing NMOS transistors and the first, second, and third equalization MOS transistors may share the n+ doped active region.

In the layout of the example embodiment bit line sense amplifier, sensing NMOS transistors and equalization NMOS transistors may share an N-type active region forming sources and/or drains. The area of the bit line sense amplifier may be reduced.

While example embodiments been particularly shown and described, it will be understood by those of ordinary skill in the art that various changes in form and details may be made therein without departing from the spirit and scope of the following claims.

What is claimed is:

1. A layout structure of a memory device, comprising:
   a first region including a sense amplifier configured to sense data from a bit line and a complementary bit line, the sense amplifier having a first sensing Metal-Oxide-Semiconductor ("MOS") transistor and a second sensing MOS transistor; and
   a second region spaced apart from the first region and including an equalizer configured to equalize the bit line and the complementary bit line, the equalizer having a first, a second, and a third equalization MOS transistor, wherein the first region and the second region share an active region.

2. The layout structure of claim 1, wherein the first and second sensing MOS transistors are N-type MOS ("NMOS") transistors, and wherein the first, the second, and the third equalization MOS transistors are NMOS transistors.

3. The layout structure of claim 1, wherein the active region is an n+ doped active region.

4. The layout structure of claim 1, wherein a gate of the first equalization MOS transistor is between a gate of the first sensing MOS transistor and a gate of the second sensing MOS transistor and parallel with a gate of the first sensing MOS transistor and a gate of the second sensing MOS transistor.

5. The layout structure of claim 1, wherein a gate of the second equalization MOS transistor and a gate of the third equalization MOS transistors are parallel and adjacent to each other and located at one side of a gate of the first equalization MOS transistor and at one side of the first region.

6. The layout structure of claim 1, wherein the first region includes a first and a second sensing P-type MOS ("PMOS") transistor at an opposite side of the first region from the first and second sensing MOS transistors.

7. The layout structure of claim 3, wherein the n+ doped active region is shared by a drain region of the first sensing MOS transistor and a source region of the first sensing MOS transistor, a drain region of the second sensing MOS transistor and a source region of the second sensing MOS transistor, and a source region of the first equalization MOS transistor and a drain region of the first equalization MOS transistor.

8. The layout structure of claim 3, wherein the n+ doped active region includes a drain region of the second equalization MOS transistor and a source region of the second equalization MOS transistor and a drain of the third equalization MOS transistor and a source region of the third equalization MOS transistor.

9. The layout structure of claim 6, wherein the bit line electrically connects a source region of the first sensing PMOS transistor, a drain region of the first sensing MOS transistor, a gate of the second sensing PMOS transistor, and a gate of the second sensing NMOS transistor using direct contacts.

10. The layout structure of claim 1, wherein the complementary bit line electrically connects a drain region of the second sensing PMOS transistor, a source region of the second sensing MOS transistor, a gate of the first sensing PMOS transistor, and a gate of the first sensing NMOS transistor using direct contacts.

11. The layout structure of claim 1, further comprising:
    a third region including the first, second, and third sensing NMOS transistors configured to equalize a drain of the first sensing PMOS transistor and a source of the first sensing NMOS transistor.

12. The layout structure of claim 11, further comprising:
    a plurality of memory cells and a sub wordline driver at a side of each memory cell of the plurality of memory cells, wherein the first, the second, and the third regions are between horizontally adjacent memory cells.

13. The layout structure of claim 12, wherein the third region is between adjacent sub-wordline drivers and between vertically adjacent memory cells.

* * * * *